(12) United States Patent
Hashimoto et al.

(10) Patent No.: US 6,930,332 B2
(45) Date of Patent: Aug. 16, 2005

(54) LIGHT EMITTING DEVICE USING LED

(75) Inventors: Takuma Hashimoto, Yawata (JP); Masaru Sugimoto, Osaka (JP); Hideyoshi Kimura, Hirakata (JP); Eiji Shiohama, Katano (JP)

(73) Assignee: Matsushita Electric Works, Ltd., Osaka (JP)

( * ) Notice: Subject to any disclaimer, the term of this patent is extended or adjusted under 35 U.S.C. 154(b) by 7 days.

(21) Appl. No.: 10/466,114

(22) PCT Filed: Aug. 28, 2002

(86) PCT No.: PCT/JP02/08697

§ 371 (c)(1),
(2), (4) Date: Jul. 22, 2003

(87) PCT Pub. No.: WO03/019679

PCT Pub. Date: Mar. 6, 2003

(65) Prior Publication Data

US 2004/0065894 A1 Apr. 8, 2004

(30) Foreign Application Priority Data

Aug. 28, 2001 (JP) .................................. 2001-258680
Nov. 6, 2001 (JP) .................................. 2001-340832

(51) Int. Cl.[7] .............................................. H01L 33/00
(52) U.S. Cl. ........................ 257/98; 257/99; 257/100
(58) Field of Search .......................... 257/98–100, 103, 257/706, 707

(56) References Cited

U.S. PATENT DOCUMENTS

| 6,501,103 | B1 | * | 12/2002 | Jory et al. .................. 257/100 |
| 2002/0163001 | A1 | * | 11/2002 | Shaddock .................... 257/79 |
| 2002/0163006 | A1 | * | 11/2002 | Yoganandan et al. ......... 257/81 |
| 2003/0189830 | A1 | * | 10/2003 | Sugimoto et al. ........... 362/294 |

FOREIGN PATENT DOCUMENTS

| JP | 54105285 | 7/1979 |
| JP | 11162231 | 6/1999 |
| JP | 11298048 | 10/1999 |
| JP | 11345999 | 12/1999 |
| JP | 2000200929 | 7/2000 |
| JP | 2000277813 | 10/2000 |
| WO | 0284750 | 10/2002 |
| WO | 0289221 | 11/2002 |

OTHER PUBLICATIONS

English Language Abstract of WO/02/84750.
English Language Abstract of WO/0289221.
English Language Abstract of JP Appln. No. 11–298048.
English Language Abstract of JP Appln. No. 11–345999.
English Language Translation of JP Appln. No. 54–105285.
English Language Abstract of JP Appln. No. 11–162231.
English Language Abstract of JP Appln. No. 2000–277813.
English Language Abstract of JP Appln. No. 2000–200929.

* cited by examiner

Primary Examiner—Minh-Loan Tran
(74) Attorney, Agent, or Firm—Greenblum & Bernstein, P.L.C.

(57) ABSTRACT

A light emitting device that can provide enhanced heat radiation as well as allowing light from a light emitting diode (LED) chip to be efficiently extracted out of the device. This light emitting device includes a metal plate (11) that is made of aluminum. The metal plate (11) has a projection (11a) projecting forward. The projection (11a) has a front side provided with a housing recess (11b). An LED chip (1) is mounted on the bottom of the housing recess (11b) so that it is thermally coupled to the metal plate (11), thus allowing heat to be radiated efficiently. A printed circuit board (12), having a grass epoxy substrate to be joined to the front surface of the metal plate (11), is provided with an insertion hole (13) into which the projection (11a) is inserted. The LED chip (1) and a bonding wire (W) are encapsulated in a transparent resin seal portion (50). The side wall of the housing recess (11b) that is part of the metal plate (11) functions as a reflector for reflecting forward light emitted from the LED chip (1). Thus, light from the LED chip (1) can be extracted efficiently.

14 Claims, 8 Drawing Sheets

PRIOR ART

LIGHT EMITTING DEVICE USING LED

TECHNICAL FIELD

The present invention relates to light emitting devices using light emitting diode (LED) chips.

BACKGROUND ART

A light emitting device using a light emitting diode chip has been conventionally proposed that is shown in FIGS. 18A and 18B. In the conventional device, the light emitting diode chip (hereinafter, referred to as LED chip) 1 is mounted on a metal mounting board 20 that includes a metal plate 21 made of a metal with a high thermal conductivity, e.g. aluminum, an insulating layer 22 made of an insulating resin material, e.g. glass epoxy and provided on a surface of the metal plate, and a wiring portion (wiring pattern) 23 that is a copper foil provided on the insulating layer 22.

The LED chip 1 is electrically connected with the wiring portion 23 through a bonding wire W. The LED chip 1 includes, for example, a sappshire substrate and a gallium nitride light emitting portion provided on the sapphire substrate.

The conventional light emitting device includes a frame member 30 that has a round hole around the LED chip 1. The frame member 30 is adhered to the metal mounting board 20 via an adhesive layer 40 (shown in FIG. 18B). The hole in the frame member 30 is filled with a transparent sealing resin such as epoxy resin, silicone resin, or the like, in which the LED chip 1 is encapsulated. Light emitted from the LED chip 1 is extracted forward (upward in FIG. 18A) through a resin seal portion 50 of the sealing resin filled in the hole in the frame member 30. The inside diameter of the round hole in the frame member 30 mainly decreases with distance from the top of the hole so that the hole has inverted trapezoidal cross section, but in the vicinity of the metal mounting board 20, the inside diameter increases toward the metal mounting board 20 as shown in FIG. 18B.

In the light emitting device, the LED chip 1 is mounted on the metal mounting board 20 with a high thermal conductivity that includes the metal plate 21 and the insulating layer 22 of about 100 μm thickness. Therefore, the light emitting device allows heat generated at the LED chip 1 to be easily radiated to the outside, as compared to a device where a surface mount LED having an LED chip therein is mounted on a circuit board. Thus, the light emitting device can advantageously protect the LED chip 1 from temperature rise that may cause decrease of the luminous efficiency, decrease of the operating life, and deterioration of the resin seal portion 50.

The frame member 30 is made of a white resin so that its inside wall 31 functions as a reflector. Light from the LED chip 1 can be reflected on the inside wall 31 of the frame member 30 to be directed forward, thus efficiently extracted from the light emitting device to the outside.

However, in the conventional light emitting device, the LED chip 1 is not mounted directly on the metal plate 21, but it is mounted over the metal plate with the insulating layer 22, which is lower in thermal conductivity than the metal plate 21 and has about 100 μm thickness, provided between them. Therefore, heat radiation of the light emitting device decreases, as compared to the case where the LED chip is mounted directly on the metal plate 21.

Additionally, the conventional light emitting device has the following disadvantage in the efficiency of light extraction from the LED chip 1. If the LED chip 1 is positioned deeper than the region of the round hole in the frame member 30 where the radius is the smallest, light from the LED chip 1 is partially blocked, thus failing to be extracted efficiently. With reference to the surface of the insulating layer 22, the surface of the LED chip 1 is at a height of about 80 μm, the thickness of the chip. The height H from the reference plane to the region of the frame member 30 where the radius of the hole is the smallest is about 300 μm that is the sum of the thickness of the adhesive layer 40, the thickness of the wiring portion 23 (the thickness of the copper foil), and the thickness of the portion of the frame member 30 where the inside diameter of the hole increases toward the metal mounting board. In other words, the inside wall 31 of the frame member 30 that functions as a reflector is located away as compared to the surface of the LED chip 1. Thus, efficient reflection of light cannot be provided.

In the case where the LED chip 1 has a transparent substrate such as sapphire substrate or the like, light emitted from the light emitting portion of the LED chip 1 is partially directed sideward. Therefore, the conventional light emitting device is disadvantageous in that light emitted sideward from the LED chip 1 fails to be efficiently extracted to the outside.

There may be a case where part of the insulating layer 22 is removed so that the LED chip 1 can be mounted on the metal plate 21 in order to improve heat radiation. In such a case, the thickness of portions that fail to function as a reflector (ineffective portions) increases by the thickness of the insulating layer 22 (about 100 μm), in addition to the height H. This further decreases the efficiency of extraction of light emitted sideward from the LED chip 1.

In the conventional light emitting device, the frame member 30 is made of a white resin for enhancing the light extraction efficiency. However, when heated in mounting process of the LED chip 1, the white resin may be oxidized to be colored, thus decreased in the reflecting ability. Further, in the case where an LED chip emitting blue light is employed as the LED chip 1, blue light emitted from the LED chip 1 may cause the frame member 30 of resin to deteriorate to be colored and thus decreased in the reflecting ability.

The present invention has been developed in view of the above mentioned problems, and it is an object of the present invention to provide a light emitting device that can enhance heat radiation while allowing light from a light emitting diode chip to be efficiently extracted to the outside, as compared to conventional devices.

DISCLOSURE OF THE INVENTION

In order to solve the above mentioned problems, an aspect of the present invention provides a light emitting device using an LED, comprising: a metal plate having a projection projecting forward, the projection having a front side provided with a housing recess; a light emitting diode chip disposed on a bottom of the housing recess to be thermally coupled to the metal plate; an insulating substrate having an insertion hole into which the projection is inserted, the insulating substrate being joined to the metal plate in layers; a light-transmissible sealing resin in which the light emitting diode chip is encapsulated.

In this structure, the light emitting diode chip is placed on the bottom of the housing recess that is a part of the metal plate so as to be thermally coupled to the metal plate. Therefore, the heat radiation can be enhanced as compared to a conventional device where a chip is mounted through the insulating layer. This can protect the light emitting diode chip from temperature rise that may cause decrease of the luminous efficiency, decrease of the operating life, and deterioration of the sealing resin. The inner surface of the housing recess, which is a part of the metal plate, functions as a light reflector so that light emanated from the light emitting diode chip can be reflected on the inner surface of the housing recess for extraction out of the housing recess. Thus, the light extraction efficiency can be increased. Since the light reflector is made of metal, not resin, it can be prevented from decrease in the reflecting ability due to heating in mounting process of the light emitting diode chip or due to exposure to light from the light emitting diode chip in making the device in use.

In the improved light emitting device, preferably, the insulating substrate has a resin filled portion in which at least part of the sealing resin is filled. This allows the encapsulation to be easily performed by using a resin suitable for molding, e.g. epoxy resin or silicone resin, as the sealing resin.

Preferably, the light emitting device further comprises a frame member joined to a front surface of the insulating substrate so as to surround the insertion hole, and the sealing resin is filled in the resin filled portion and the frame member. This arrangement can easily and economically provide a space to be filled with the sealing resin as well as ensuring the resin filling.

Preferably, in the light emitting device, the insulating substrate is a three-dimensional molded circuit board having a wiring portion extended along a peripheral surface of the resin filled portion for electrical connection to the light emitting diode chip. This allows the three-dimensional resin filled portion to be formed integrally with the insulating substrate, thus facilitating not only the assembling but also the electrical connection between the light emitting diode chip and the wiring portion.

In the improved light emitting device, preferably, the metal plate serves as a part of the wiring portion for electrical connection to the light emitting diode chip. This allows a light emitting diode chip having electrodes at both sides in the direction of the thickness to be mounted on the bottom of the housing recess so that the electrode arranged at the rear side of the chip can be connected to the electric wiring.

In the improved light emitting device, preferably, the housing recess has an inner surface provided with a reflecting film of a metal with a reflectance higher than a reflectance of the metal plate. In this arrangement, the function of the metal plate and the function of the reflector can be provided separately. Therefore, the material used for the metal plate can be selected from a variety of materials. For example, the metal plate can be made of a material selected in view of the adhesive property with respect to the insulating substrate or in view of the thermal conductivity.

In the light emitting device, preferably, the frame member has an inside wall provided with a reflecting film of a metal with a reflectance higher than a reflectance of the frame member. This allows light emitted from the light emitting diode chip to be efficiently extracted out of the device.

Preferably, the light emitting device further comprises a circuit component mounting substrate joined to the front surface of the insulating substrate alongside of the frame member, the circuit component mounting substrate having a front surface provided with a wiring portion. Further, it is preferable that the circuit component mounting substrate has a thickness such that the frame member is prevented from protruding forward beyond the circuit component mounting substrate. This allows a surface-mount circuit component to be easily mounted at the front side of the circuit component mounting substrate by a reflow process.

Preferably, in the light emitting device, the insulating substrate has a reflector, of which reflectance is higher than the insulating substrate, on a front surface thereof inside the frame member. This can provide further increased efficiency of light extraction from the light emitting diode chip to the outside.

In the improved light emitting device, preferably, the housing recess has a periphery configured to be a segment of a paraboloid of revolution. This allows light emitted sideward or backward from the light emitting diode chip to be efficiently reflected and directed forward, thus providing further increased efficiency of light extraction from the light emitting diode chip to the outside.

In the improved light emitting device, preferably, the insulating substrate has a portion on which the metal plate is not layered, the portion of the insulating substrate having a back at which circuit components are mounted. This allows even a lead-mount circuit component to be mounted without the risk of a short-circuit via the metal plate. Further, since light emitted from the light emitting diode chip is prevented from being absorbed in or reflected on the circuit component, the light can be extracted to the outside further efficiently.

BEST MODES FOR EMBODYING THE INVENTION

Referring now to the accompanying drawings, preferred embodiments of the present invention will be described.
(Embodiment 1)

Figure 1:
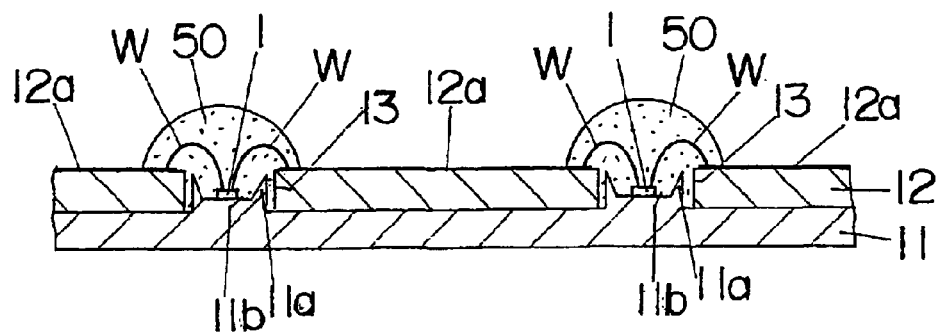
FIG. 1 is a schematic cross sectional view of a light emitting device according to Embodiment 1 of the present invention.

As shown in FIG. 1, a light emitting device according to this embodiment includes a metal plate 11 that is made of aluminum and has a plurality of cylindrical projections 11a each projecting forward (upward in FIG. 1) and a printed circuit board 12 that has a grass epoxy substrate as the insulating substrate and is joined, in layers, to the front surface of the metal plate 11. Each of the projections 11a has a front side provided with a housing recess 11b, in which a light emitting diode chip (hereinafter, referred to as an LED chip) 1 is accommodated. The LED chip 1 is encapsulated in a transparent resin seal portion 50, together with a bonding wire W, which will be described below.

The housing recess 11b formed in the metal plate 11 is sized so that the LED chip 1 is mounted directly on the bottom of the recess while the depth of the recess is larger than the thickness of the LED chip 1.

The LED chip 1 is mounted (disposed) in a state where it is thermally coupled to the bottom face (lowermost part) of the housing recess 11b. In other words, the LED chip 1 is thermally coupled to the metal plate 11.

The housing recess 11b is configured to be circular, and the inside diameter increases with the distance from the bottom. In other words, the side wall of the housing recess 11b is outwardly tilted. This allows light from the LED chip 1 that is emitted sideward to be reflected on the tilted side wall of the housing recess 11b for extraction through the housing recess 11b.

The printed circuit board 12 has one side provided with a copper foil as a wiring portion (wiring pattern) 12a while being adhered to the metal plate 11 at the other side. The printed circuit board 12 has, in the direction of the thickness, a plurality of insertion holes 13 in which the projections 11a of the metal plate 11 are inserted respectively. It should be noted that the printed circuit board 12 has a thickness substantially identical to the height of the projection 11a projecting forward from the front surface of the metal plate 11.

The wiring portion 12a provided at the front of the printed circuit board 12 is extended to the vicinity of the insertion hole 13 and electrically connected with the LED chip 1 through a thin metal wire, e.g. a thin gold wire, as the bonding wire W. As described above, the bottom of the housing recess 11b, on which the LED chip 1 is mounted, is positioned ahead of the joining portion between the metal plate 11 and the printed circuit board 12. This allows a pad (not shown) for wiring that is provided on the LED chip 1 to be arranged substantially flush with the wiring portion 12a, thus facilitating the electrical connection between the LED chip 1 and the wiring portion 12a by use of the bonding wire W.

The LED chip 1 is a blue LED chip that has a sapphire substrate and a gallium nitride light emitting portion formed thereon.

The LED chip 1 and the bonding wire W is encapsulated in the resin seal portion 50 of transparent resin such as epoxy resin, silicone resin, or the like. The resin seal portion 50 is formed, for example, by dropping epoxy resin for molding. Alternatively, the resin seal portion 50 may be formed from epoxy resin suitable for transfer molding by using a metal mold. This can make it easy to shape the resin seal portion 50 in a desired way. For example, the resin seal portion 50 can be shaped like a hemisphere, that is, being convex at the front, in order to function as a lens.

In this embodiment, the metal plate 11 is 0.6 mm thick. The diameter of the projection 11a of the metal plate is 1 mm and its height is 0.3 mm. The depth of the housing recess 11b is 0.3 mm and the diameter of its bottom is 0.7 mm. The printed circuit board 12 has a thickness of 0.3 mm. The LED chip 1 has a chip area of 350 $\mu m^2$ and a thickness of 80 $\mu m$ so that it can be mounted on the bottom of the housing recess 11b.

In the light emitting device according to this embodiment, the LED chip 1 is disposed to be thermally coupled to the bottom of the housing recess 11b at the front of the projection 11a projecting from the metal plate 11. This allows heat generated at the LED chip 1 to be rapidly radiated through the metal plate 11 to the outside. More particularly, the metal plate 11 can function as a radiator. Further, the LED chip 1 is arranged so that its front surface is positioned deeper than the top of the projection 11a. This allows light emitted sideward from the LED chip 1 to be reflected on the tilted side wall of the housing recess 11b formed in the projection 11a so that the reflected light can be extracted from the light emitting device to the outside (forward), thus providing improved efficiency of light extraction from the LED chip 1.

The portion that functions as a reflector is the tilted metal side wall of the housing recess 11b formed in the metal projection 11a formed integrally with the metal plate 11 capable of heat radiation. This reflector is free from deterioration due to oxidation when heated in the mounting process of the LED chip 1, in contrast to the conventional reflector of white resin. Further, this reflector can be prevented from decrease in the reflecting ability due to the deterioration of resin that is caused by receiving blue light emitted from the LED chip 1.

In this embodiment, the space between the side wall of the insertion hole 13 in the printed circuit board 12 and the periphery of the projection 11a is a resin filled portion in which at least part of sealing resin is filled.
(Embodiment 2)

Figure 2:
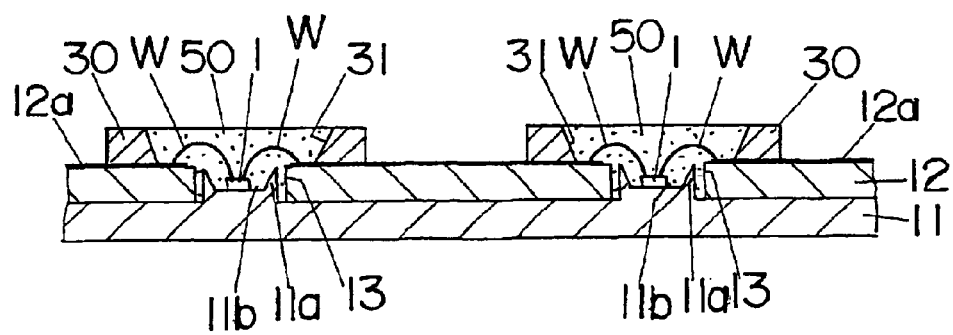
FIG. 2 is a schematic cross sectional view of a light emitting device according to Embodiment 2 of the present invention.

As shown in FIG. 2, a light emitting device according to this embodiment includes a frame member 30 in addition to the components included in the light emitting device according to Embodiment 1. By adding this member, the configuration of a resin seal portion 50 is modified. Since the light emitting device according to this embodiment is substantially identical in basic structure to the device according to Embodiment 1, like components are denoted by like numerals and will be explained in no more detail.

The frame member 30 is made of a white plastic resin and configured like a frame (circular). The frame member is joined to the front surface of the printed circuit board 12 so as to surround the insertion hole 13. Sealing resin, which forms the resin seal portion 50, is poured into the frame member 30 for encapsulation of an LED chip 1 and a bonding wire W. The front surface of the resin seal portion 50 and the front surface of the frame member 30 are arranged to be substantially flush in the vertical direction. The inside diameter of the frame member 30 gradually becomes greater toward its front surface. The resin seal portion 50 is formed by dropping transparent epoxy resin.

Thus, in this embodiment, the frame member 30 allows the resin seal portion 50 to be formed into a desired shape even if a sealing resin for molding is used as the material of the resin seal portion 50.

The wiring portion 12a provided at the front of the printed circuit board 12 is extended to the vicinity of the insertion hole 13 through under the frame member 30. Therefore, even with the frame member 30, the electrical connection between the LED chip 1 and the wiring portion 12a can be easily carried out with the bonding wire W. The LED chip 1 is a blue LED chip that has a sapphire substrate and a gallium nitride light emitting portion formed on the substrate, in the same manner as Embodiment 1.

In this embodiment, in the same manner as Embodiment 1, a metal plate 11 is 0.6 mm thick. The diameter of a projection 11a of the metal plate is 1 mm and its height is 0.3 mm. The depth of a housing recess 11b is 0.3 mm and the diameter of its bottom is 0.7 mm. The printed circuit board 12 has a thickness of 0.3 mm. The LED chip has a chip area of 350 $\mu m^2$ and a thickness of 80 $\mu m$. The frame member 30 is 3 mm in inside diameter and 1 mm in thickness.

Figure 3:
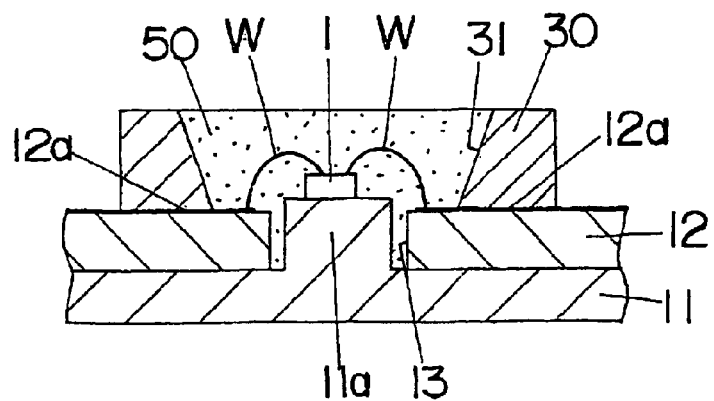
FIG. 3 is a schematic cross sectional view of another example of the same.

In another example of the light emitting device according to this embodiment, as shown in FIG. 3, the top of the projection 11a is configured to be substantially flush with or ahead of the front surface of the printed circuit board 12. An LED chip 1 is mounted on the top of the projection 11a. In this case, light emanated sideward from the LED chip 1 can be reflected on the lower end of the frame member 30 or transmitted for extraction out of the light emitting device.

(Embodiment 3)

Figure 4:
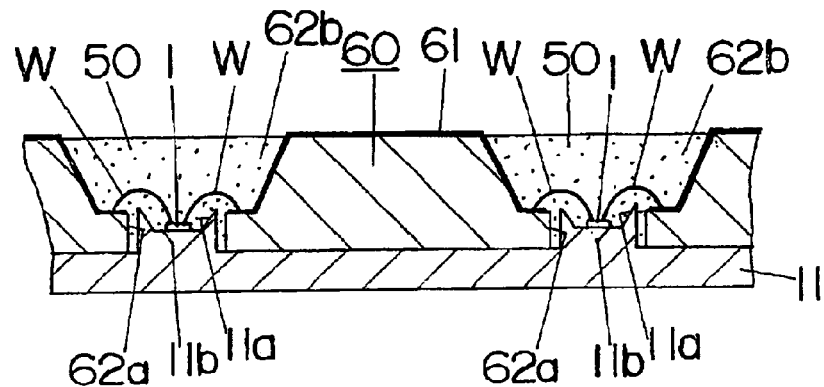
FIG. 4 is a schematic cross sectional view of a light emitting device according to Embodiment 3 of the present invention.

As shown in FIG. 4, a light emitting device according to this embodiment includes a MID (Molded Interconnected Device) substrate 60 (three-dimensional molded circuit board) that has a resin insulating substrate molded to be non-planar and a wiring portion 61 provided in three dimensions on the surfaces of the insulating substrate, in place of the printed circuit board 12 described in Embodiment 1. Like components as those of Embodiment 1 are denoted by like numerals and will be explained in no more detail.

The MID substrate 60 is joined to the front surface of a metal plate 11. The MID substrate 60 has an insertion hole 62a into which a projection 11a projecting forward from the front surface of the metal plate 11 is inserted and a hole as a resin filled portion 62b that is communicated with the insertion hole 62a and is larger in inside diameter than the insertion hole 62a. The inside diameter of the resin filled portion increases toward the opening. The insertion hole and the resin filled portion are formed during molding of the MID substrate 60. The resin filled portion 62a and the space between the side wall of the insertion hole 62a and the periphery of the projection 11a are filled with sealing resin, for forming a resin seal portion 50. The thickness of the MID substrate 60 around the insertion hole 62a is substantially the same as the height of the projection 11a.

The wiring portion 61 provided at the front of the MID substrate 60 is extended toward the insertion hole 62b along the side wall of the resin filled portion 62b so that the wiring portion 61 is electrically connected with an LED chip 1 through a bonding wire W. The LED chip 1 is a blue LED chip that has a sapphire substrate and a gallium nitride light emitting portion formed thereon, in the same manner as Embodiment 1.

In this embodiment, in the same manner as Embodiment 1, the metal plate 11 is 0.6 mm thick. The diameter of the projection 11a is 1 mm and its height is 0.3 mm. The depth of a housing recess 11b is 0.3 mm and the diameter of its bottom is 0.7 mm.

The insulating substrate of the MID substrate 60 is 0.3 mm thick at the part around the insertion hole 62a while it is 1.3 mm thick at the part around the resin filled portion 62b.

The insulating substrate of the MID substrate 60 is made of Amodel (a trademark of BP Amoco Polymers, Inc.). Alternatively, the insulating substrate of the MID substrate 60 may be made of polyphthalamide resin.

The front surface of the resin seal portion 50 and the front surface of the MID substrate 60 are arranged to be substantially flush in the vertical direction. In this embodiment, the resin filled portion 62b is provided in the MID substrate 60. This can eliminate the steps of forming an additional frame member 30 (refer to FIG. 2) in which sealing resin is filled and adhering it as required in Embodiment 2, thus facilitating the assembling as compared to Embodiment 2.

Figure 5:
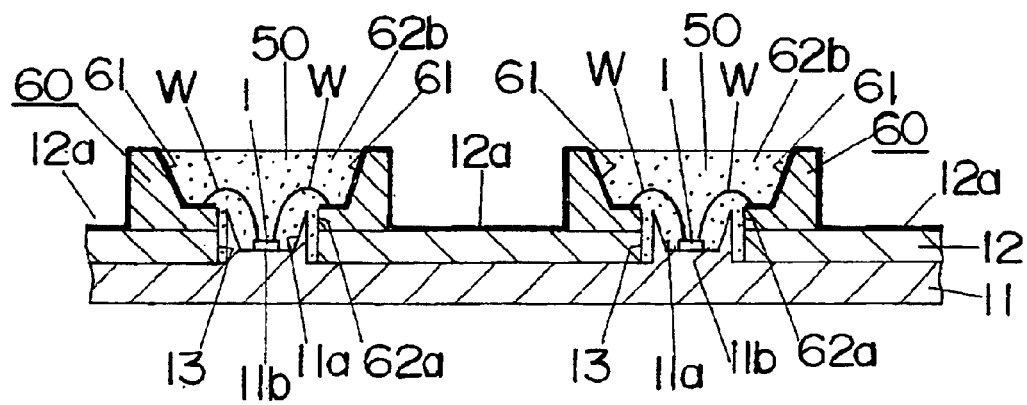
FIG. 5 is a schematic cross sectional view of another example of the same.

FIG. 5 shows another example of the light emitting device according to this embodiment. In this example, a printed circuit board 12 having a glass epoxy substrate as insulating substrate is joined to the front surface of a metal plate 11 having a plurality of projections 11a each projecting forward from the front surface. Provided on the front surface of the printed circuit board 12 are MID substrates 60 each for a single LED chip 1. In contrast to the above described device according to this embodiment that uses a single MID substrate 60 for a plurality of LED chips 1, this example uses an MID substrate 60 provided individually for a respective LED chip.

Each of the MID substrates 60 has an insertion hole 62a that is configured to be continuous with respect to an insertion hole 13 provided in the printed circuit board 12 and a hole as a resin filled portion 62b that is communicated with the insertion hole 62a.

In this example, the wiring portion 61 of the MID substrate 60 is connected with the LED chip 1 through a bonding wire W while being connected with a wiring portion 12a of the printed circuit board 12.

Generally, an MID substrate is difficult to be increased in size as well as being relatively expensive. The structure shown in FIG. 5 can minimize the amount of MID substrate to be used so as to reduce the cost while allowing the light emitting device to be increased in size.

(Embodiment 4)

Figure 6:
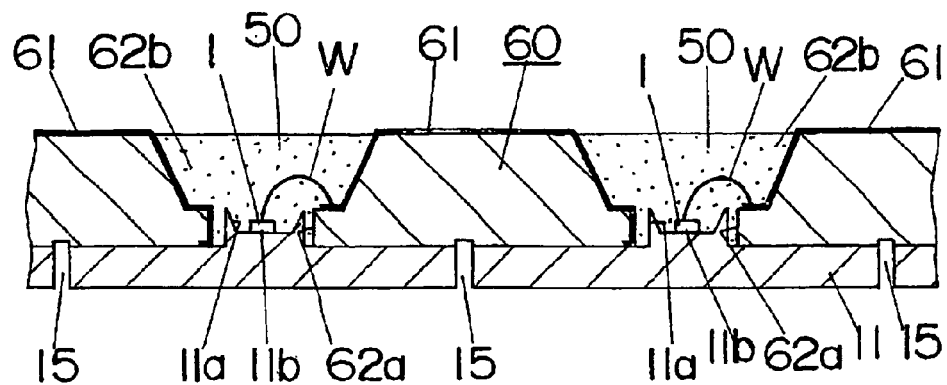
FIG. 6 is a schematic cross sectional view of a light emitting device according to Embodiment 4 of the present invention.

As shown in FIG. 6, a light emitting device according to this embodiment has a groove 15 formed by cutting a metal plate 11 with a rotary cutter. The groove 15 allows projections 11a to be electrically isolated from each other. Further, an MID substrate 60 in this embodiment has a wiring portion 61 that is partially extended to the back of the MID substrate 60 along the side wall of a resin filled portion 62b and the side wall of an insertion hole 62a so as to be electrically connected with the metal plate 11. Since the other arrangement of this embodiment is substantially identical to that of Embodiment 3 shown in FIG. 4, like components are denoted by like numerals and will be explained in no more detail.

An LED chip 1 in this embodiment is a red LED chip that has a light emitting portion of AlInGaP and electrodes provided at both sides in the direction of the thickness of the chip. The LED chip 1 is mounted on a housing recess 11b with the back side being adhered to the bottom of the housing recess 11b by using an electrically conductive paste (such as a silver paste). This causes the electrode provided at the back side of the LED chip 1 to be electrically connected with the metal plate 11. The electrode (pad) provided at the front side of the LED chip 1 is electrically connected with the wiring portion 61 of the MID substrate 60 through a bonding wire W.

In this embodiment, in the same manner as Embodiment 3, the metal plate 11 is 0.6 mm thick. The diameter of the projection 11a is 1 mm and its height is 0.3 mm. The depth of the housing recess 11b is 0.3 mm and the diameter of its bottom is 0.7 mm.

In this embodiment, an LED chip having electrodes at both sides in the direction of the thickness can be used as the LED chip 1. Further, if a plurality of LED chips are connected in parallel, currents flowing through the respective LED chips are varied depending on their voltage characteristics. In this embodiment, the LED chips 1 are connected in series. This can prevent the variations of currents flowing through the respective LED chips. In addition, this embodiment allows regulation resistors to be connected in parallel so as to regulate the currents individually.

(Embodiment 5)

Figure 7:
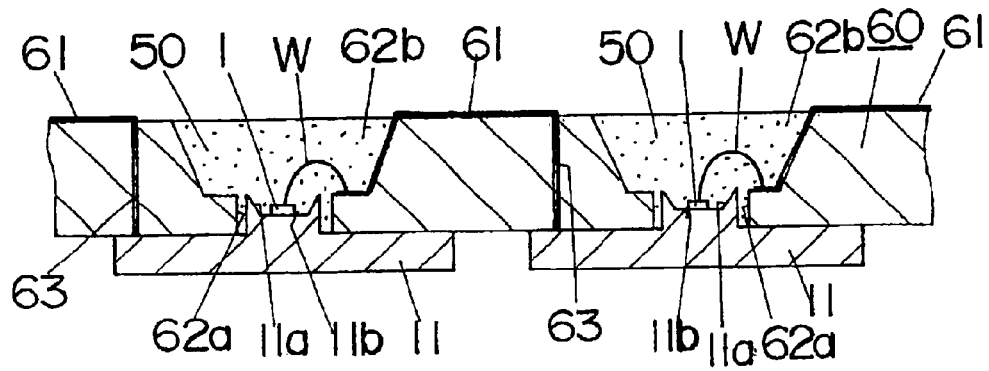
FIG. 7 is a schematic cross sectional view of a light emitting device according to Embodiment 5 of the present invention.

As shown in FIG. 7, a light emitting device according to this embodiment includes a single MID substrate 60 and a plurality of metal plates 11 each having a projection 11a. Each of the metal plates 11 is adhered to the back side (the lower side in FIG. 7) of the MID substrate 60. The MID substrate 60 has a surface (front surface) provided with a wiring portion 61, which is partially extended via a through hole 63 to the back side of the MID substrate so as to be electrically connected with the metal plate 11. Since the other arrangement of this embodiment is substantially identical to that of Embodiment 4, like components are denoted by like numerals and will be explained in no more detail.

In this embodiment, in the same manner as Embodiment 4, the metal plate 11 is 0.6 mm thick. The diameter of the projection 11a is 1 mm and its height is 0.3 mm. The depth of a housing recess 11b is 0.3 mm and the diameter of its bottom is 0.7 mm.

In this embodiment, in the same manner as Embodiment 4, an LED chip having electrodes at both sides in the direction of the thickness can be used as the LED chip 1. Further, in the same manner as Embodiment 4, this embodiment can prevent the variations of currents flowing through the respective LED chips as well as allowing the currents to be regulated individually.

(Embodiment 6)

Figure 8:
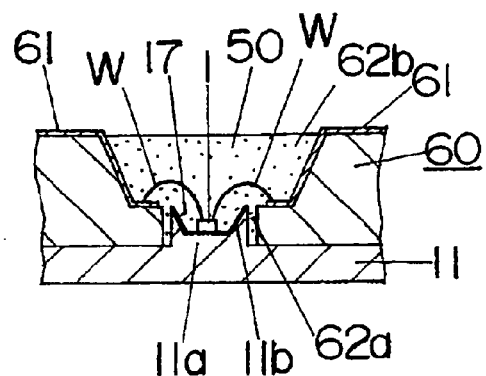
FIG. 8 is a schematic cross sectional view of a light emitting device according to Embodiment 6 of the present invention.

As shown in FIG. 8, a light emitting device according to this embodiment is substantially identical in basic structure to the device according to Embodiment 3 that is shown in FIG. 4. Like components are denoted by like numerals as those of Embodiment 3 and will be explained in no more detail.

This embodiment employs as a metal plate 11 a copper plate in place of the aluminum plate, because copper plates are superior, in both adhesive property with respect to an MID substrate 60 and thermal conductivity, to aluminum plates. The thermal conductivity of copper is 403 W/(m·K) while the thermal conductivity of aluminum is 236 W/(m·K).

The light emitting device has a reflecting film 17 made of aluminum, which is provided on the bottom and side wall of a housing recess 11b formed at the front of a projection 11a projecting forward from the front surface of the metal plate 11. The reason is that aluminum is higher in light reflectance than copper. The reflecting film 17 is provided by masking the metal plate 11 with the exception of the housing recess 11b followed by depositing an aluminum film onto the bottom and side wall of the housing recess 11b.

In this embodiment, in the same manner as Embodiment 3, the metal plate 11 is 0.6 mm thick. The diameter of the projection 11a is 1 mm and its height is 0.3 mm. The depth of the housing recess 11b is 0.3 mm and the diameter of its bottom is 0.7 mm.

The MID substrate 60 has an insulating substrate that is 0.3 mm thick at the part around an insertion hole 62a and 1.3 mm thick at the part around a resin filled portion 62b. The resin filled portion 62b is a circular hole, of which the inside diameter increases toward the opening.

The insulating substrate of the MID substrate 60 is made of Amodel (a trademark of BP Amoco Polymers, Inc.). Alternatively, the insulating substrate of the MID substrate 60 may be made of polyphthalamide resin.

Since the metal plate 11 is a copper plate in this embodiment, the metal plate 11 can be favorably adhered to the insulating substrate of the MID substrate 60 as well as allowing heat generated at the LED chip 1 to be efficiently radiated to the outside, as compared with a metal plate made of aluminum.

In this embodiment, the LED chip 1 is a blue LED chip in the same manner as Embodiment 3. Since copper has a low reflectance at blue wavelength region, it may lower the efficiency of light extraction from the LED chip 1 to the outside. In order to prevent the lowering, the reflecting film 17 of aluminum higher in reflectance than copper is provided on the bottom and side wall of the housing recess 11b. Thus, the light emitting device can be provided that has increased light extraction efficiency as well as radiating heat efficiently. The material for the reflecting film 17, which is provided on the bottom and side wall of the housing recess 11b, is not limited to aluminum used in this embodiment but may be another material, e.g. silver. The reflecting film 17 of silver can be implemented by silver plating, for example.

The reflecting film 17 in this embodiment, which is made of a metal having a reflectance higher than that of the metal plate 11 and is disposed on the inner surfaces of the housing recess 11b, allows the metal plate 11 to be made of a desired material regardless of the reflectance, hence extending the range of choices for the material. For example, the metal plate 11 can be made of a material selected in view of the adhesive property with respect to the insulating substrate of the MID substrate 60 or the capacity of heat radiation.

(Embodiment 7)

Figure 9:
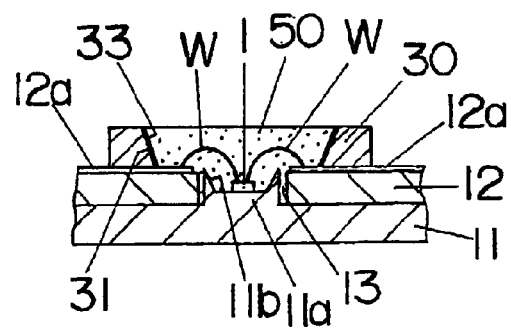
FIG. 9 is a schematic cross sectional view of a light emitting device according to Embodiment 7 of the present invention.

As shown in FIG. 9, a light emitting device according to this embodiment is similar to the light emitting device according to Embodiment 2. Therefore, like components are denoted by like numerals as those of Embodiment 2 and will be explained in no more detail.

The light emitting device according to this embodiment is different from Embodiment 2 in that it has a reflecting film 33 of aluminum formed on an inside wall 31 of a frame member 30 and a dispersing agent scattered within the sealing resin in a resin seal portion 50. The reflecting film 33 may be made of silver, for example, in place of aluminum used in this embodiment. The reflecting film 17 of silver can be implemented by silver plating, for example.

In this embodiment, in the same manner as Embodiment 2, a metal plate 11 is 0.6 mm thick. The diameter of a projection 11a is 1 mm and its height is 0.3 mm. The depth of a housing recess 11b is 0.3 mm and the diameter of its bottom is 0.7 mm. A printed circuit board 12 is 0.3 mm thick.

An LED chip has a chip area of 350 m² and a thickness of 80 μm. The frame member 30 is 3 mm in inside diameter and 1 mm in thickness.

If the dispersing agent or fluorescent particles are scattered in the sealing resin, light emanated from the LED chip 1 in the forward direction passes through the sealing resin without diffusion. As a result, the light is mostly extracted out of the device without shining on the inside wall 31 of the frame member 30.

On the other hand, the light emitting device according to this embodiment has the dispersing agent, which serves to uniformalize the intensity distribution of luminous radiation, scattered within the sealing resin in the resin seal portion 50. Therefore, light emanated from the LED chip 1 can pass through the resin seal portion 50 while being diffused by the dispersing agent. Since the reflecting film 33 is formed on the inside wall 31 of the frame member 30, the light diffused by the dispersing agent toward the inside wall of the frame member 30 is reflected on the reflecting film 33 for extraction to the outside. This can provide increased light extraction efficiency, as compared to a case using no reflecting film 33, in which light is reflected on the surface of the frame member 30 itself.

(Embodiment 8)

Figure 10:
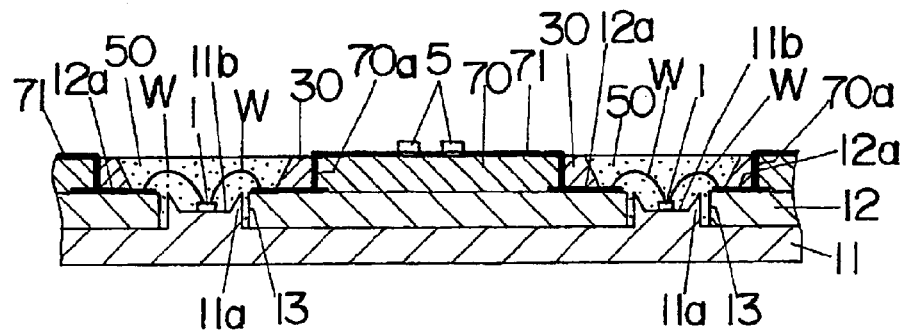
FIG. 10 is a schematic cross sectional view of a light emitting device according to Embodiment 8 of the present invention.

As shown in FIG. 10, a light emitting device according to this embodiment includes a printed circuit board 70 having a glass epoxy substrate as the insulating substrate. The printed circuit board 70 is joined to the front surface of the insulating substrate of a printed circuit board 12, alongside of a frame member 30. The printed circuit board 70 is a substrate on which a circuit component is mounted. As the other arrangement of the light emitting device according to this embodiment is substantially identical to that of Embodiment 2, like components are denoted by like numerals and will be explained in no more detail.

The printed circuit board 70 has a copper foil as a wiring portion (wiring pattern) 71 at the front side while being joined to the front surface of the printed circuit board 12 at the rear (back) side. The printed circuit board 70 has a hole 70a formed at a location corresponding to the frame member 30. The wiring portion 71 provided at the front of the printed circuit board 70 is extended along the side wall of the hole 70a for electrical connection with a wiring portion 12a of the printed circuit board 12.

The printed circuit board 70 is substantially as thick as or thicker than the frame member 30 so as to prevent the frame member 30 from protruding forward beyond the printed circuit board 70. The printed circuit board 70 is a circuit component mounting substrate.

When mounting on a circuit board circuit components such as a resistor, a transistor, and the like by a reflow process, it is necessary to mask the circuit board for applying solder paste only to the region where the circuit components are placed. In the above described light emitting device according to Embodiment 2, as shown in FIG. 2, the front side of the printed circuit board 12 is not flat with the frame member 30 protruded. This makes the masking troublesome.

On the other hand, the light emitting device according to this embodiment includes the printed circuit board 70 substantially identical in thickness to the frame member 30 as described above. More particularly, the front surface of the printed circuit board 70 is substantially flush with the front surface of the frame member 30, hence making it easy to mount surface-mount circuit components 5 on the front of the printed circuit board 70 by a reflow process.

The insulating substrate of the printed circuit board 70 as the circuit component mounting substrate is not limited to the glass epoxy substrate used in this embodiment. Further, the printed circuit board 70 on which the circuit components are mounted may be thicker than the frame member 30 rather than being substantially as thick as the frame member 30. In such a case, the printed circuit board 70 can be also masked so that the circuit components 5 can be efficiently mounted by the reflow process.

Figure 11:
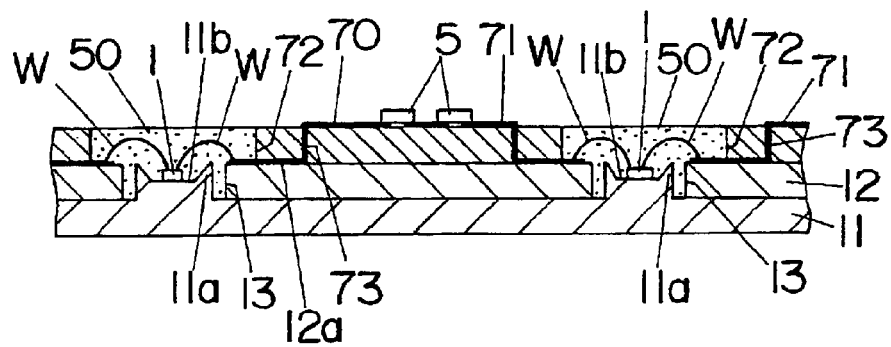
FIG. 11 is a schematic cross sectional view of another example of the same.

FIG. 11 shows another example of the light emitting device according to this embodiment. In this example, a printed circuit board 70 has a resin filled portion 72 communicating with an insertion hole 13 formed in a printed circuit board 12 so that the printed circuit board 70 can serve as a frame member. Provided at the front of the printed circuit board 70 is a wiring portion 71, which is partially extended to the back of the printed circuit board 70 via a through hole 73 to be electrically connected with the wiring portion 12a of the printed circuit board 12.

Such a structure can facilitate the mounting of surface-mount circuit components 5, e.g. a resistor and a transistor, by the reflow process as well as the structure according to this embodiment shown in the preceding figure. Since a separate frame member 30 (as shown in FIG. 10) is not required, the assembling can be simplified. In addition, the positioning between the resin filled portion 72 and the insertion hole 13 can be made easy because this structure permits them to be positioned together.

Figure 12:
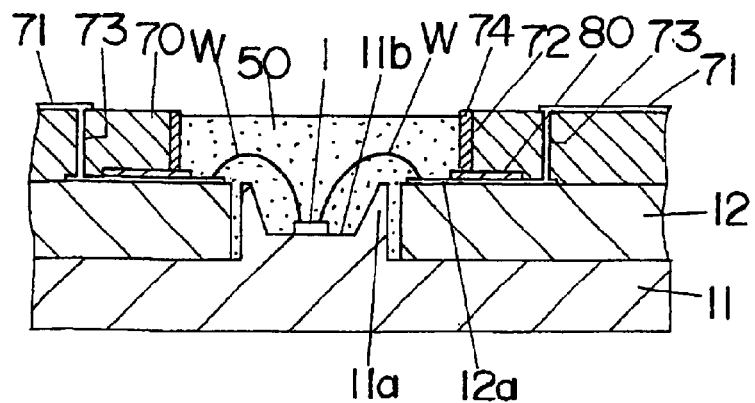
FIG. 12 is a schematic cross sectional view of still another example of the same.

In this structure, the printed circuit board 70 as a circuit component mounting substrate may have a reflecting film 74 provided on the side wall of the resin filled portion 72, as shown in FIG. 12. The reflecting film 74 is formed from a material having a reflectance higher than that of the printed circuit board 70. This allows the frame member, for defining a portion to be filled with sealing resin, to serve as a reflecting wall. The reflecting film 74 provides increased efficiency of light extraction from an LED chip 1 to the outside. The reflecting film 74 is provided by through-hole plating. In this case, the reflecting film 74 and the wiring portion 12a are electrically isolated from each other through an insulating film 80. Instead of through-hole plating, the reflecting film 74 may be formed by, for example, applying a coat of white paint, which is higher in reflectance than the printed circuit board 70, to the side wall of the resin filled portion 72. In such a case, the insulating film 80 is not required.

(Embodiment 9)

Figure 13A:
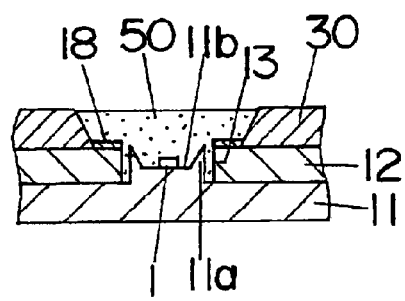
FIG. 13A is a schematic cross sectional view of a light emitting device according to Embodiment 9 of the present invention.
Figure 13B:
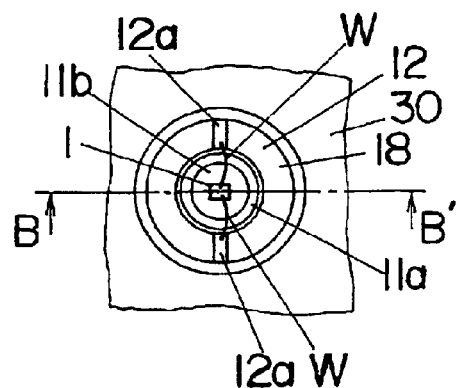
FIG. 13B is a schematic plan view of the light emitting device according to Embodiment 9 in a state before sealing resin is filled.

As shown in FIGS. 13A and 13B, a light emitting device according to this embodiment includes a substantially circular reflector 18 disposed on the front surface of a portion of the insulating substrate of a printed circuit board 12 that is exposed inside a frame member 30. As the other arrangement of the light emitting device according to this embodiment is substantially identical to that of Embodiment 2, like components are denoted by like numerals and will be explained in no more detail.

The reflector 18 is configured so as not to cover a wiring portion 12a (part) provided at the front of the printed circuit board 12 for connection with an LED chip 1. The reflector 18 can be formed from any material having a reflectance higher than that of the insulating substrate of the printed circuit board 12. In this embodiment, the reflecting member 18 is formed from white silk for use in silk-screen printing. In place of white silk, a metal film, for example, having a reflectance higher than that of the insulating substrate may be used as the reflecting member 18.

The light emitting device according to this embodiment allows light emitted from an LED chip 1 to be further efficiently extracted out of the device because the reflector

18 higher in reflectance than the insulating substrate is provided, inside the frame member 30, on the front surface of the insulating substrate of the printed circuit board 12.

(Embodiment 10)

Figure 14:
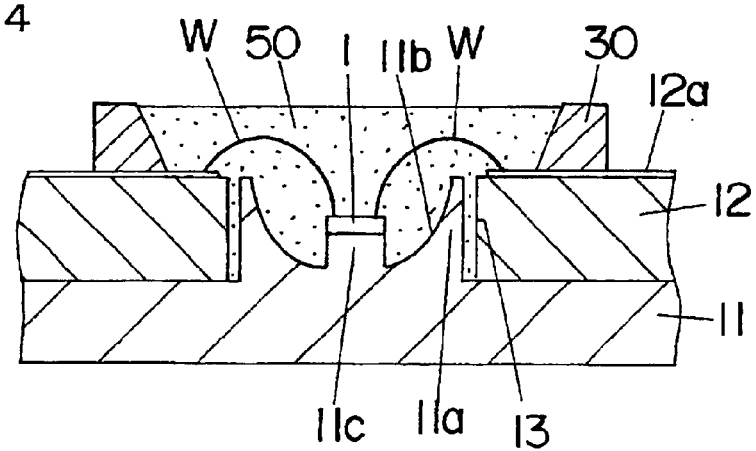
FIG. 14 is a schematic cross sectional view of a light emitting device according to Embodiment 10 of the present invention.

As shown in FIG. 14, a light emitting device according to this embodiment includes a metal plate 11 provided with a projection 11*a* having a housing recess 11*b* of which the periphery is in the configuration of a segment of a paraboloid of revolution. Further, the metal plate 11 has an integrally formed mounting portion 11*c* on which an LED chip 1 is placed. The mounting portion is projected forward from the bottom of the housing recess 11*b*. As the other arrangement of the light emitting device according to this embodiment is substantially identical to that of Embodiment 2, like components are denoted by like numerals and will be explained in no more detail.

The housing recess 11*b* is axisymmetric and open forward of the metal plate 11. The axis of symmetry is coincident with the central axis of the paraboloid of revolution. The mounting portion 11*c* has such a height that, when the LED chip 1 is placed on the mounting portion 11*c*, the paraboloid of revolution has focal point in the center of the light emitting layer of the LED chip 1.

The light emitting device according to this embodiment allows light emitted from the side surface of the LED chip 1, in particular, to be efficiently reflected on the periphery of the housing recess 11*b*, which is in the configuration of a segment of a paraboloid of revolution, so as to be directed forward. This can provide increased light extraction efficiency.

Figure 15:
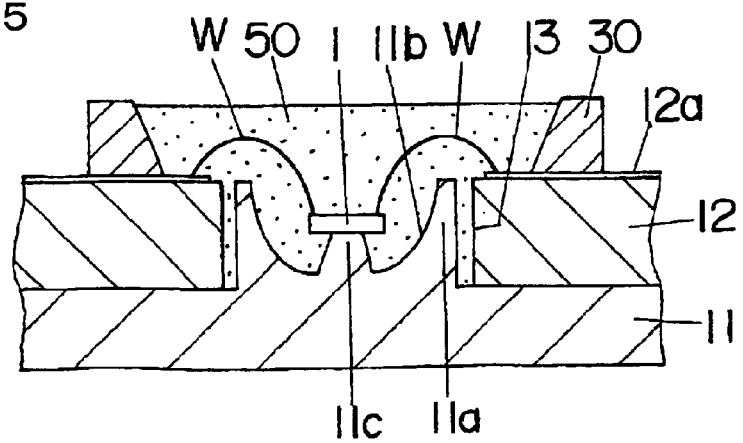
FIG. 15 is a schematic cross sectional view of another example of the same.

FIG. 15 shows another example of the light emitting device according to this embodiment. In this example, a mounting portion 11*c* has a front surface that is configured smaller than the chip area of the LED chip 1. This allows part of light emitted backward from the LED chip 1 to be efficiently reflected toward the front side of the light emitting device, thus providing further increased light extraction efficiency as compared to the device shown in the preceding figure that has the mounting portion 11*c* of which the area of the front surface is substantially as large as or slightly larger than the chip area of the LED chip 1.

(Embodiment 11)

Figure 16:
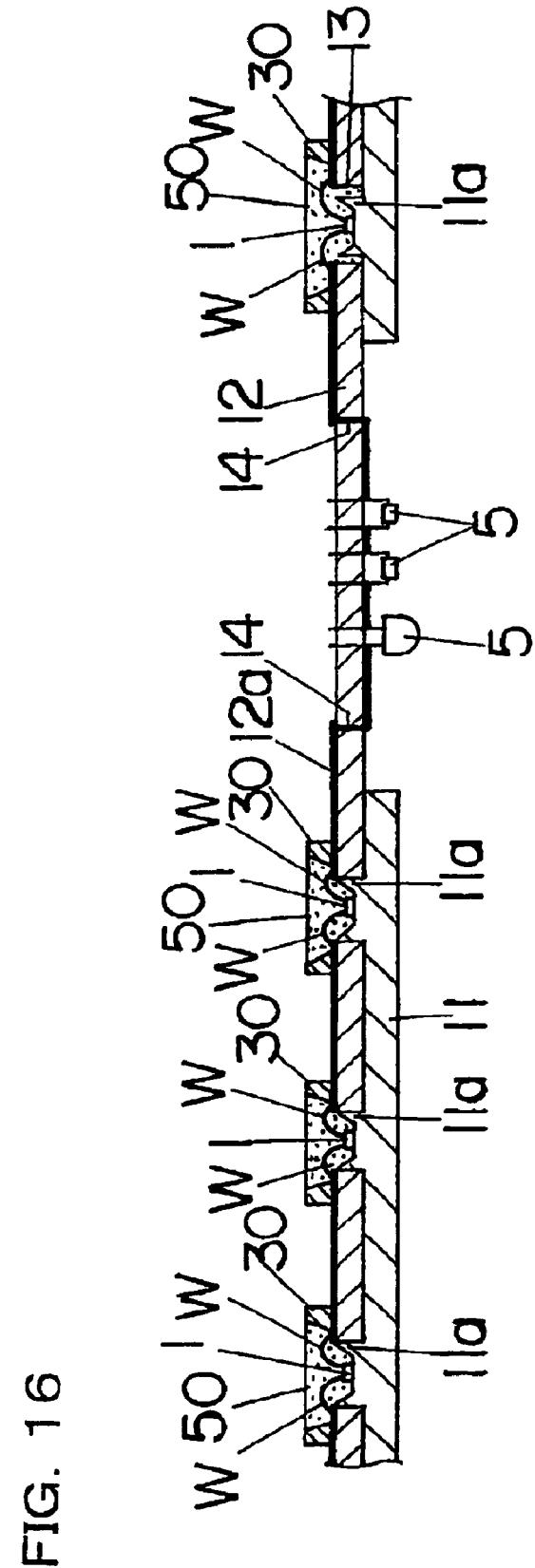
FIG. 16 is a schematic cross sectional view of a light emitting device according to Embodiment 11 of the present invention.
Figure 17:
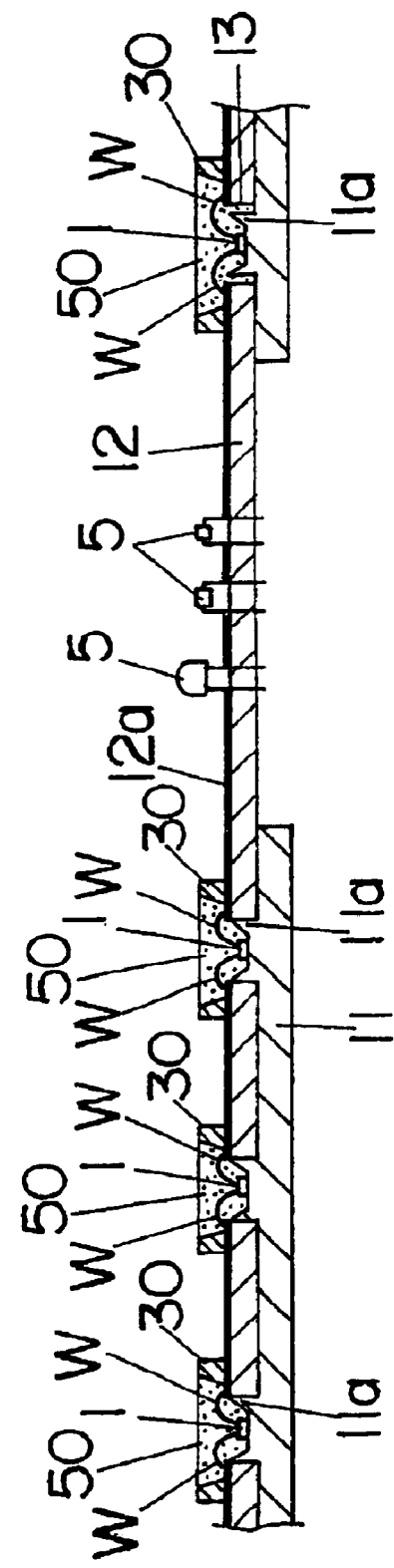
FIG. 17 is a schematic cross sectional view of an example shown for reference purposes in the same.
Figure 18A:
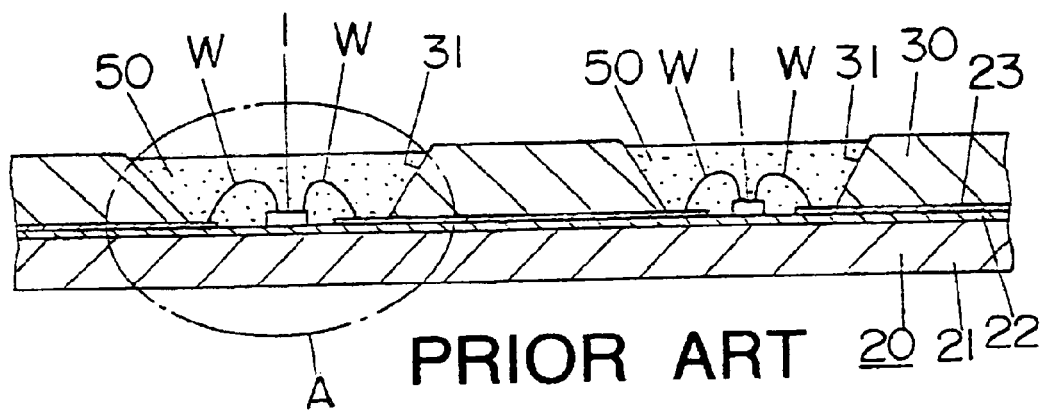
FIG. 18A is a schematic cross sectional view of a conventional light emitting device.
Figure 18B:
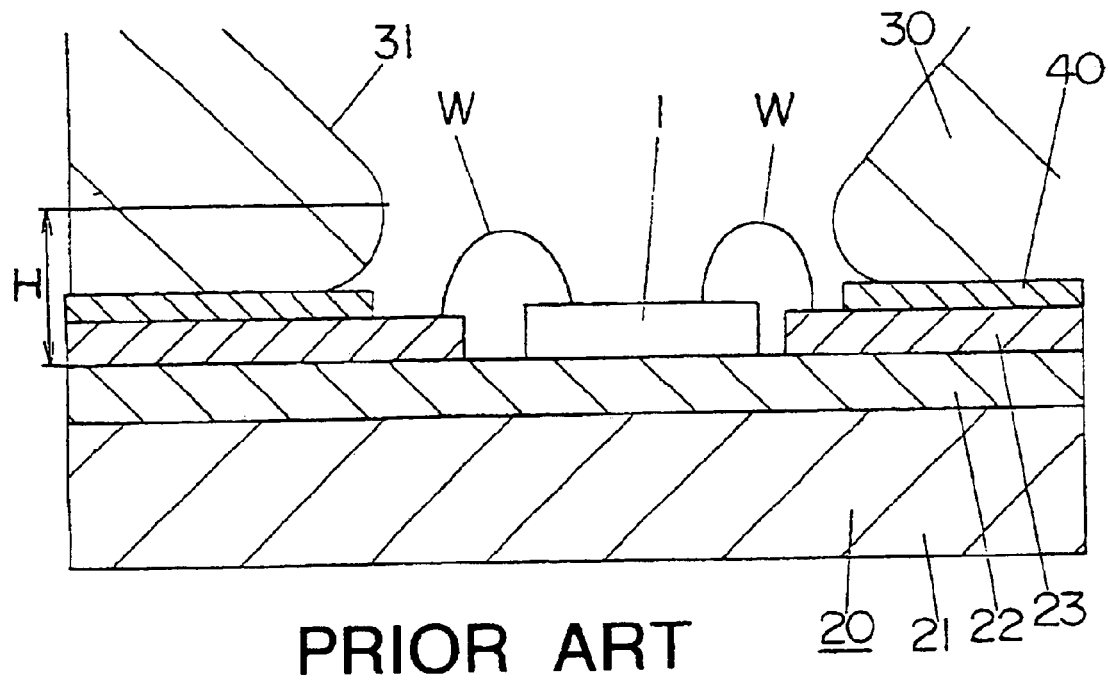
FIG. 18B is a magnified view of main portions of the conventional device that are denoted by A in FIG. 18A.

As shown in FIG. 16, a light emitting device according to this embodiment is substantially identical in basic structure to the light emitting device according to Embodiment 2 (see FIG. 2), but this light emitting device includes a printed circuit board 12 having a portion on which a metal plate 11 is not layered. Mounted at the back of the portion of the printed circuit board are lead-mount circuit components 5 in a cluster. FIG. 17 shows an example, for reference, of a light emitting device in which a printed circuit board 12 has a portion on which a metal plate 11 is not disposed, in the same manner as the light emitting device according to this embodiment, but lead-mount circuit components 5 are mounted in a cluster at the front side of the portion of the printed circuit board.

Either of the two light emitting devices described above is advantageous in that it allows such lead-mount circuit components 5 to be mounted on the printed circuit board 12 without the risk of a short-circuit via the metal plate 11.

In the light emitting device according to this embodiment, the printed circuit board 12 has a front surface provided with a wiring portion 12*a*, which is extended via a through hole 14 to the back of the portion of the printed circuit board on which the metal plate 11 is not disposed, for connection with the lead of each of the circuit components 5 arranged together at the back of the portion. This structure makes the light emitting device according to this embodiment superior to the device described above for reference. More specifically, in the light emitting device according to this embodiment, light emitted from an LED chip 1 can be radiated forward without being absorbed in or reflected on the circuit component 5, whereby the light emitting device enables the mounting of the lead-mount circuit components 5 while allowing the light from the LED chip 1 to be efficiently extracted out of the device.

INDUSTRIAL APPLICATIONS

The present invention is widely applicable to a number of primary industries employing a power of light converted from electric energy as the light source. Among the light source for emanating a large power of light while the heat radiation and the light extraction efficiency being improved are a light source for illumination, a light source for indicating the action of a switch, a light source in a traffic signal, a light source for displaying an alarm in an automobile, and a light source for advertisement.

What is claimed is:

1. A light emitting device using an LED, comprising:
   a metal plate having a frontwardly extending projection, the projection having a front provided with a housing recess;
   a light emitting diode chip disposed on a bottom of the housing recess to be thermally coupled to the metal plate;
   an insulating substrate having an insertion hole into which the projection extends, the insulating substrate being joined to the metal plate in layers; and
   a light-transmitting sealing resin in which the light emitting diode chip is encapsulated.

2. The light emitting device according to claim 1, wherein the insulating substrate has a resin filled portion in which at least part of the sealing resin extends.

3. The light emitting device according to claim 2, further comprising a frame member joined to a front surface of the insulating substrate so as to surround the insertion hole, wherein the sealing resin provides a resin filled portion of the frame member.

4. The light emitting device according to claim 3, wherein the frame member has an inside wall provided with a metallic reflecting film having a reflectance higher than a reflectance of the frame member.

5. The light emitting device according to claim 2, wherein the insulating substrate is a three-dimensional molded circuit board having a wiring portion extending along a peripheral surface of the resin filled portion for electrical connection to the light emitting diode chip.

6. The light emitting device according to claim 1, wherein the metal plate comprises part of the wiring portion for electrical connection to the light emitting diode chip.

7. The light emitting device according to claim 1, wherein the housing recess has an inner surface provided with a metallic reflecting film having a reflectance higher than a reflectance of the metal plate.

8. The light emitting device according to claim 1, wherein the housing recess has a periphery configured as a segment of a paraboloid of revolution.

9. The light emitting device according to claim 1, said metal plate having a plurality of projections and at least one groove positioned between at least two of said projections whereby the adjacent projections are electrically isolated from each other.

10. The light emitting device according to claim 1, said housing recess having a wall extending frontwardly from the metal plate, said wall being spaced from a wall of the insertion hole and light emitting ceiling resin being provided in the space between the housing recess wall and the insertion hole wall.

11. The light emitting device according to claim 1, further comprising a mounting portion projecting forwardly from a bottom of the housing recess, the light emitting diode chip being mounted on the mounting portion.

12. A light emitting device using an LED, comprising:
- a metal plate having a frontwardly extending projection, the projection having a front provided with a housing recess;
- a light emitting diode chip disposed on a bottom of the housing recess to be thermally coupled to the metal plate;
- an insulating substrate having an insertion hole into which the projection extends, the insulating substrate being joined to the metal plate in layers;
- a light-transmitting sealing resin in which the light emitting diode chip is encapsulated, the insulating substrate having a resin filled portion in which at least part of the sealing resin extends,
- a frame member joined to a front surface of the insulating substrate so as to surround the insertion hole, the sealing resin providing resin filled portion of the frame member, and
- a circuit component mounting substrate joined to a front surface of the insulating substrate adjacent the frame member, the circuit component mounting substrate having a front surface provided with a wiring portion,
- wherein the circuit component mounting substrate has a thickness such that the frame member is prevented from protruding forward beyond the circuit component mounting substrate.

13. A light emitting device using an LED, comprising:
- a metal plate having a frontwardly extending projection, the projection having a front provided with a housing recess;
- a light emitting diode chip disposed on a bottom of the housing recess to be thermally coupled to the metal plate;
- an insulating substrate having an insertion hole into which the projection extends, the insulating substrate being joined to the metal plate in layers;
- a light-transmitting sealing resin in which the light emitting diode chip is encapsulated, the insulating substrate having a resin filled portion in which at least part of the sealing resin extends,
- a frame member joined to a front surface of the insulating substrate so as to surround the insertion hole, the sealing resin providing a resin filled portion of the frame member, and
- the insulating substrate having a reflector with a reflectance that is higher than a reflectance of the insulating substrate, on a front surface of the insulating substrate inside the frame member.

14. A light emitting device using an LED, comprising:
- a metal plate having a frontwardly extending projection, the projection having a front provided with a housing recess;
- a light emitting diode chip disposed on a bottom of the housing recess to be thermally coupled to the metal plate;
- an insulating substrate having an insertion hole into which the projection extends, the insulating substrate being joined to the metal plate in layers; and
- a light-transmitting sealing resin in which the light emitting diode chip is encapsulated,
- wherein the insulating substrate has a predetermined portion at which the metal plate is not provided, the predetermined portion of the insulating substrate having a surface at which circuit components are mounted.

* * * * *